(12) United States Patent
Kim et al.

(10) Patent No.: US 9,099,639 B2
(45) Date of Patent: Aug. 4, 2015

(54) RESISTANCE SWITCHING MATERIAL ELEMENT AND DEVICE EMPLOYING THE SAME

(71) Applicants: Kyung-min Kim, Goyang-si (KR); Young-bae Kim, Seoul (KR); Chang-jung Kim, Yongin-si (KR); Sung-ho Kim, Yongin-si (KR); Sae-jin Kim, Hwaseong-si (KR); Seung-ryul Lee, Seoul (KR); Man Chang, Seoul (KR); Eun-ju Cho, Gyeongbuk (KR)

(72) Inventors: Kyung-min Kim, Goyang-si (KR); Young-bae Kim, Seoul (KR); Chang-jung Kim, Yongin-si (KR); Sung-ho Kim, Yongin-si (KR); Sae-jin Kim, Hwaseong-si (KR); Seung-ryul Lee, Seoul (KR); Man Chang, Seoul (KR); Eun-ju Cho, Gyeongbuk (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 6 days.

(21) Appl. No.: 13/962,470

(22) Filed: Aug. 8, 2013

(65) Prior Publication Data

US 2014/0042380 A1 Feb. 13, 2014

(30) Foreign Application Priority Data

Aug. 10, 2012 (KR) .................. 10-2012-0087993

(51) Int. Cl.
*H01L 45/00* (2006.01)
*H01L 27/24* (2006.01)

(52) U.S. Cl.
CPC ............ *H01L 45/08* (2013.01); *H01L 27/2409* (2013.01); *H01L 45/1233* (2013.01); *H01L 45/145* (2013.01); *H01L 27/2481* (2013.01)

(58) Field of Classification Search
None
See application file for complete search history.

(56) References Cited

U.S. PATENT DOCUMENTS

| | | | |
|---|---|---|---|
| 6,849,891 B1 | 2/2005 | Hsu et al. | |
| 2009/0148981 A1 | 6/2009 | Lai et al. | |
| 2010/0258782 A1* | 10/2010 | Kuse et al. | 257/4 |
| 2011/0193043 A1 | 8/2011 | Chin | |
| 2011/0193051 A1 | 8/2011 | Nam et al. | |
| 2011/0220860 A1 | 9/2011 | Kim et al. | |
| 2012/0001141 A1 | 1/2012 | Hsieh et al. | |
| 2012/0018695 A1 | 1/2012 | Lee et al. | |
| 2012/0032132 A1 | 2/2012 | Lee et al. | |
| 2012/0049145 A1 | 3/2012 | Lee et al. | |

FOREIGN PATENT DOCUMENTS

| | | |
|---|---|---|
| KR | 2005-0055582 A | 6/2005 |
| KR | 2011-0092092 A | 8/2011 |
| KR | 2011-0101983 A | 9/2011 |
| KR | 2012-0010050 A | 2/2012 |
| KR | 2012-0012049 A | 2/2012 |
| KR | 2012-0020557 A | 3/2012 |
| KR | 2012-0020989 A | 3/2012 |
| KR | 2012-0021539 A | 3/2012 |
| KR | 2012-0022218 A | 3/2012 |
| KR | 2012-0032909 A | 4/2012 |
| KR | 2012-0043343 A | 5/2012 |

* cited by examiner

*Primary Examiner* — Andres Munoz
(74) *Attorney, Agent, or Firm* — Harness, Dickey & Pierce, P.L.C.

(57) ABSTRACT

According to example embodiments, a resistance switching material element includes a resistance switching material layer between a first electrode and a second electrode, and a self-rectifying layer provided between the resistance switching material layer and one of the first and second electrodes. The second electrode may be on the first electrode.

13 Claims, 9 Drawing Sheets

RESISTANCE SWITCHING MATERIAL ELEMENT AND DEVICE EMPLOYING THE SAME

CROSS-REFERENCE TO RELATED APPLICATIONS

This application claims priority under 35 U.S.C. §119 to Korean Patent Application No. 10-2012-0087993, filed on Aug. 10, 2012, in the Korean Intellectual Property Office, the disclosure of which is incorporated herein in its entirety by reference.

BACKGROUND

1. Field

Example embodiments relate to a resistance switching material element, a device including one or more resistance switching material elements, manufacturing methods thereof, and/or a method of operating a device employing a resistance switching material element.

2. Description of the Related Art

When an element that uses resistance switching properties integrated in the form of an element including a crossbar structure is used as a memory device, data may be inaccurately read or written due to interference signals generated from adjacent memory cells. This is because a partial electric signal may be applied to an adjacent memory cell when reading data from or writing data to a cell in the crossbar structure. To address this matter, a selector, such as a switch or a rectifier diode, may be connected to each memory cell in order to reduce (and/or stop) the partial electric signal, but the structure becomes complicated.

In order to connect a selector and an element that uses resistance switching properties, an element having the properties of a selector may be manufactured and then the element may be connected to a resistance switching element. However, the number of processes and the costs of materials of the selector may increase. Also, the structure of a general selector may have a structure of at least three layers of metal/non-metal/metal. As a result, an overall thickness of an element may increase if the element includes a general selector. Thus, it may be undesirable to use for a general selector in an element that has a thickness limit.

SUMMARY

Example embodiments relate to a resistance switching material element with self-rectifying properties, inherently including the properties of a selector, and a device employing the resistance switching material element.

Example embodiments also relate to a device including one or more resistance switching material elements.

Additional aspects will be set forth in part in the description which follows and, in part, will be apparent from the description, or may be learned by practice of example embodiments.

According to example embodiments, a resistance switching material element includes: a first electrode; a second electrode on the first electrode; a resistance switching material layer between the first electrode and the second electrode; and a self-rectifying layer between the resistance switching material layer and one of the first electrode and the second electrode.

In example embodiments, the self-rectifying layer may contact the resistance switching material layer.

In example embodiments, the self-rectifying layer may be configured to have a tunneling mechanism that varies according to an applied voltage.

In example embodiments, a first voltage may be less than a second voltage, the self-rectifying layer may be configured to have direct tunneling properties in which flow of current is restricted if the first voltage is applied to the resistive switching material element, the self-rectifying layer may be configured to have tunneling properties in which the flow of current rapidly increases if the second voltage is applied to the resistance switching material element.

In example embodiments, the self-rectifying layer may include a first area and a second area, and the first area and the second area may have different conduction band offsets in a thickness direction of the self-rectifying layer.

In example embodiments, one of the first and second areas may have a relatively larger conduction offset than a conduction band offset of an other of the first and second areas, and the one of the first and second area may be closer to a direction in which current to generate a change in resistance is applied to the resistance switching material layer.

In example embodiments, the conduction band offsets of the first and second areas may differ by about 0.5 eV or higher.

In example embodiments, the conduction band offsets of the first and second areas may differ by about 1.0 eV to about 4.0 eV, inclusive.

In example embodiments, the self-rectifying layer include a first dielectric material layer including the first area and a second dielectric material layer including the second area, and a material of second dielectric layer may be different than a material of the first dielectric material layer.

In example embodiments, one of the first and second dielectric material layers may be a low dielectric material layer having a relatively large conduction band offset, and another one of the first and second dielectric material layers may be a high dielectric material layer having a relatively small conduction band offset.

In example embodiments, at least one of the first and second dielectric material layers may include one of $SiO_2$, $Al_2O_3$, $Y_2O_3$, $La_2O_3$, $HfO_2$, $ZrO_2$, $Nb_2O_5$, $TiO_2$, $Ta_2O_5$, $(Ba,Sr)TiO_3$, and $SrTiO_3$.

In example embodiments, the self-rectifying layer may be formed of a dielectric material, the first area and the second area may have desired thicknesses such that one of the first area and the second area has one of a relatively high permittivity and a relatively low permittivity compared to an other of the first area and the second area, and the first and second areas may have different permittivities in the thickness direction of the self-rectifying layer.

In example embodiments, the resistance switching material layer may include a first material layer and a second material layer, and the resistance switching material layer may be configured to have resistance switching properties due to ionic species transfer between the first and second material layers.

In example embodiments, the first material layer may be an oxygen supply layer and the second material layer may be an oxygen exchange layer In example embodiments, the first material layer may be a first metal oxide and the second material layer may be a second metal oxide, and the first metal oxide and the second metal oxide may be the same as or different from each other.

In example embodiments, at least one of the first and second metal oxides may include one of Ta oxide, Zr oxide, Y oxide, yttria-stabilized zirconia (YSZ), Ti oxide, Hf oxide, Mn oxide, Mg oxide, and combinations thereof.

In example embodiments, an oxygen concentration of the second material layer may be higher than an oxygen concentration of the first material layer.

According to example embodiments, a memory device may include at least one memory cell including the above resistance switching material element.

According to example embodiments, a memory device includes: a first wiring; a second wiring crossing the first wiring; and a memory cell between the first and second wirings at an intersection of the first and second wirings, wherein the memory cell includes a resistance switching material layer and a self-rectifying layer, and the memory cell is connected to the first and second wirings. The self-rectifying layer may be between the resistance switching material layer and one of the first and second wirings.

In example embodiments, the first wiring may be one among a plurality of first wirings arranged parallel to each other, the second wiring may be one among a plurality of the second wirings arranged parallel to each other, the plurality of second wirings may cross the plurality of first wirings, the memory cell may be one among a plurality of memory cells, and each one of the memory cells may be at a corresponding intersection between one of the plurality of first wirings and one of the plurality of second wirings.

According to example embodiments, a resistance switching material element includes: a first electrode; a self-rectifying layer on at least one of the first electrode and the resistance switching material layer; and a second electrode on an uppermost one of the resistance switching material layer and the self-rectifying layer.

In example embodiments, the self-rectifying layer may be configured to have a tunneling mechanism that varies according to a voltage applied to the first electrode and the second electrode, the self-rectifying layer may include a first area and a second area, and the first area and the second area may have different conduction band offsets in a thickness direction of the self-rectifying layer.

In example embodiments, the resistance switching material layer may include a first material layer and a second material layer, the first material layer may be an oxygen supply layer, the second material layer may be an oxygen exchange layer. At least one of the first and at least one of the first and second material layers may include one of Ta oxide, Zr oxide, Y oxide, yttria-stabilized zirconia (YSZ), Ti oxide, Hf oxide, Mn oxide, Mg oxide, and combinations thereof.

According to example embodiments, a memory device includes: a plurality of first wirings arranged parallel to each other; a plurality of second wirings arranged parallel to each other, the plurality of second wirings crossing over the plurality of first wirings; and a plurality of memory cells. Each of the plurality of memory cells may be electrically connected to one of the plurality of first wirings and one of the plurality of second wirings at an intersection between the one of the plurality of first wirings and the one of the plurality of second wirings. Each of the plurality of memory cells may include one of the above resistance switching material elements.

BRIEF DESCRIPTION OF THE DRAWINGS

These and/or other aspects will become apparent and more readily appreciated from the following description of non-limiting embodiments, as illustrated in the accompanying drawings in which like reference characters refer to the same parts throughout the different views. The drawings are not necessarily to scale, emphasis instead being placed upon illustrating principles of inventive concepts. In the drawings.

DETAILED DESCRIPTION

Figure 1:
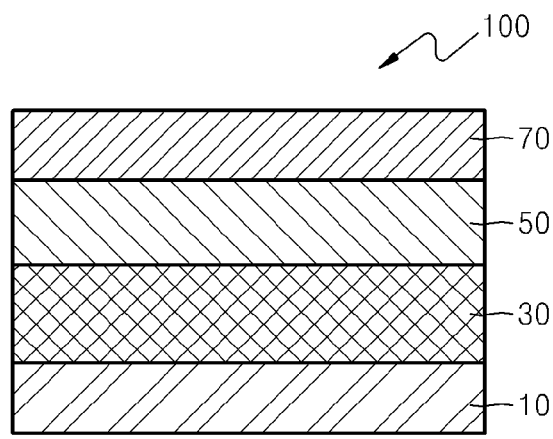
FIG. 1 schematically illustrates a resistance switching material element according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

As used herein, the term "and/or" includes any and all combinations of one or more of the associated listed items. Expressions such as "at least one of," when preceding a list of elements, modify the entire list of elements and do not modify the individual elements of the list.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
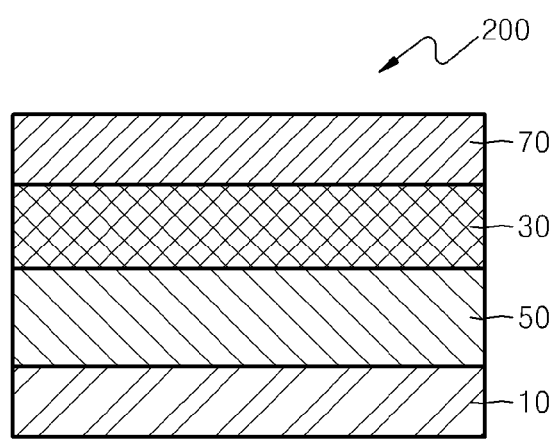
FIG. 2 schematically illustrates a resistance switching material element according to example embodiments.

FIGS. 1 and 2 schematically illustrate resistance switching material elements 100 and 200 according to example embodiments. Referring to FIGS. 1 and 2, the resistance switching material elements 100 and 200 may include a self-rectifying layer 30 and a resistance switching material layer 50 between a first electrode 10 and a second electrode 70. FIG. 1 illustrates an example in which the self-rectifying layer 30 is located between the first electrode 10 and the resistance switching material layer 50. FIG. 2 illustrates an example in which the self-rectifying layer 30 is located between the resistance switching material layer 50 and the second electrode 70. Alternatively, the self-rectifying layer 30 may be located between the first electrode 10 and the resistance switching material layer 50 and between the resistance switching material layer 50 and the second electrode 70, respectively.

Considering that the resistance switching material elements 100 and 200 may be manufactured on a substrate, the first electrode 10 may correspond to a lower electrode and the second electrode 70 may correspond to an upper electrode.

A variety of electrode materials generally used in the field of semiconductor devices may be used as a material for the first electrode 10. For example, the first electrode 10 may be formed of, for example, a base metal, such as W, Ni, Al, Ti, Ta, TiN, TiW, and TaN, or a conductive oxide, such as indium zinc oxide (IZO) and indium tin oxide (ITO). Also, the first electrode 10 may be formed of a noble metal material that is expensive and exhibits low reactivity, for example, a noble metal, such as Ir, Ru, Pd, Au, and Pt, or a metal oxide, such as $IrO_2$. In other words, the first electrode 10 may include at least one of W, Ni, Al, Ti, Ta, TiN, TiW, TaN, IZO, ITO, Ir, Ru, Pd, Au, Pt, and $IrO_2$. However, example embodiments are not limited thereto The second electrode 70 may be formed of materials that are the same as or similar to the first electrode 10. For example, the second electrode 70 may be formed of a noble metal, such as Ir, Ru, Pd, Au, and Pt, or a metal oxide, such as $IrO_2$, or a base metal, such as W, Ni, Al, Ti, Ta, TiN, TiW, and TaN, or a conductive oxide, such as IZO and ITO. The materials of the second electrode 70 are not limited thereto and a variety of materials may be used therefor.

The self-rectifying layer 30 may have properties of a selector, such as a switch or a diode, and may be provided to limit (and/or stop) a partial electric signal. For example, when resistance switching material elements 100 and 200 according to example embodiments are integrated in the form of elements in which a crossbar point array or a crossbar is partially included and used as memory cells in a memory device as illustrated in FIG. 13, 14, 15A, or 15B that are described below, a partial electric signal is applied to a cell that is adjacent to another cell from which data is read or to which data is written, in a crossbar structure. The self-rectifying layer 30 may limit (and/or stop) the partial electric signal and thus accurate data writing or reading may be possible without interfering signals from adjacent memory cells.

The resistance switching material elements 100 and 200 with the properties of a selector each may include the self-rectifying layer 30 having the properties of a selector and the resistance switching material layer 50, as illustrated in FIGS. 1 and 2. The order of deposition of the self-rectifying layer 30 and the resistance switching material layer 50 may be reversible.

The self-rectifying layer 30 may be provided to contact the resistance switching material layer 50 and have a tunneling mechanism that varies according to an applied voltage. In other words, the self-rectifying layer 30 may function as a selector and the resistance switching material layer 50 may be directly connected to the self-rectifying layer 30 without an intervening electrode layer.

Also, the self-rectifying layer 30 may be provided, for example, to have direct tunneling properties in which flow of current is restricted, at a first voltage that is a relatively low voltage, and tunneling properties in which the flow of current rapidly increases, for example, Fowler-Nordheim tunneling properties or trap assisted tunneling properties, at a second voltage that is relatively higher than the first voltage. The self-rectifying layer may be configured to have direct tunneling properties in which a flow of current is rested if a first voltage is applied to the resistance switching material element, and the self-rectifying layer may be configured to have tunneling properties in which the flow of current rapidly increased is a second voltage is applied to the resistance switching material element, and the first voltage may be less than the second voltage.

To obtain such a tunneling mechanism, the self-rectifying layer 30 may be formed as a structure in which the heights of conduction band offsets in both of interfacial boundaries are different from each other. To this end, the self-rectifying layer 30 may include a junction of materials having different conduction band offsets. The self-rectifying layer 30 may include a portion having a high band gap and a portion having a low band gap by adjusting a conduction band offset value, by partially adding a dopant, and/or by adding a defect within a homogeneous material.

Figure 3:
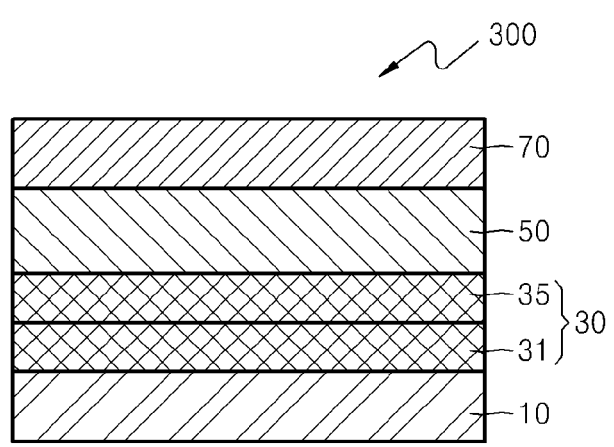
FIG. 3 schematically illustrates a resistance switching material element according to example embodiments.
Figure 4:
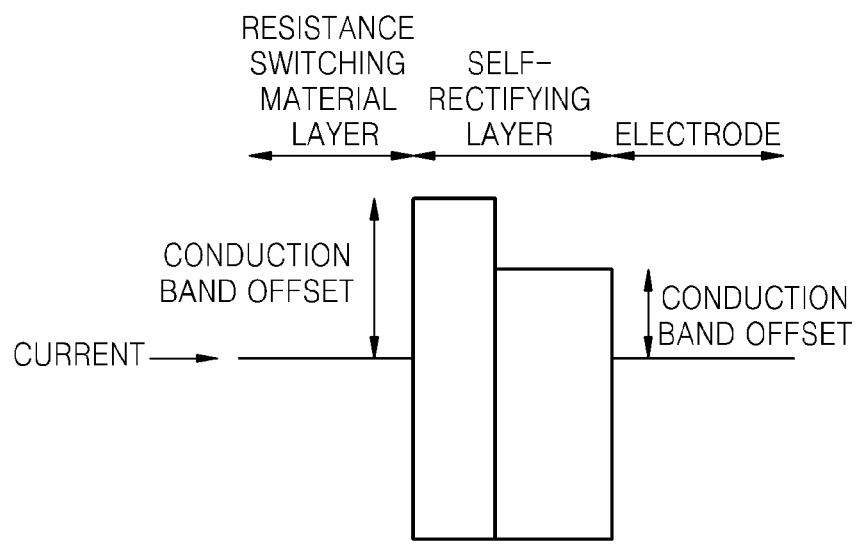
FIG. 4 is a band diagram of a self-rectifying layer configured to obtain a tunneling effect capable of operating in contact with a material having resistance switching properties, that is, a resistance switching material layer, in the resistance switching material element of FIG. 3.
Figure 5:
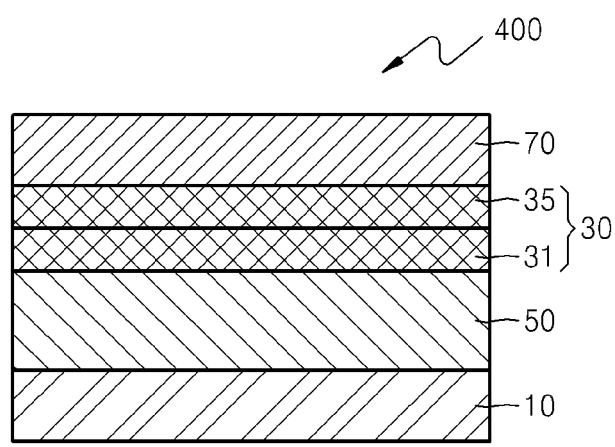
FIG. 5 schematically illustrates a resistance switching material element according to example embodiments.
Figure 6:
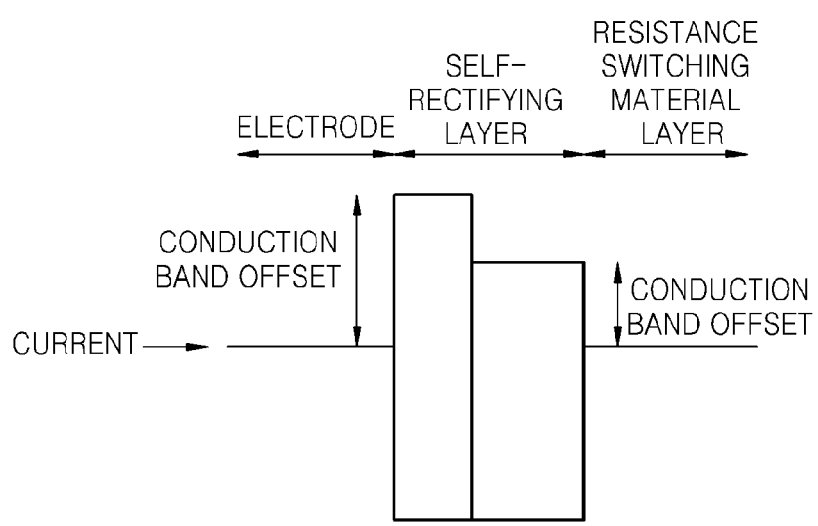
FIG. 6 is a band diagram of a self-rectifying layer configured to obtain a tunneling effect capable of operating in contact with a material having resistance switching properties, that is, a resistance switching material layer, in the resistance switching material element of FIG. 5.

In other words, the self-rectifying layer 30 may include a first area 31 and a second area 35 having different conduction band offsets that are different from each other in a thickness direction of a layer, as illustrated in FIGS. 3 and 5. FIG. 3 illustrates an example in which a resistance switching material element 300 has the deposition order of FIG. 1, and the self-rectifying layer 30 includes the first area 31 and the second area 35. FIG. 4 is a band diagram of the self-rectifying layer 30 configured to obtain a tunneling effect capable of operating in contact with a material having resistance switching properties, that is, the resistance switching material layer 50, in the resistance switching material element 300 of FIG. 3. FIG. 5 illustrates an example in which a resistance switching material element 400 has the deposition order of FIG. 2, and the self-rectifying layer 30 includes the first area 31 and the second area 35. FIG. 6 is a band diagram of the self-rectifying layer 30 configured to obtain a tunneling effect capable of operating in contact with a material having resistance switching properties, that is, the resistance switching material layer 50, in the resistance switching material element 400 of FIG. 5;

As illustrated in FIGS. 3 through 6, the self-rectifying layer 30 may be arranged such that one of the first and second areas 31 and 35, which is closer to a direction in which current to generate a change in resistance, is applied to the resistance switching material layer 50 has a relatively large conduction band offset.

For example, as illustrated in FIGS. 1 and 3, when the resistance switching material layer 50 is disposed above the self-rectifying layer 30 and current is supplied through the second electrode 70 that is disposed above the resistance switching material layer 50, the second area 35 relatively closer to the resistance switching material layer 50 may have a relatively large conduction band offset and the first area 31 disposed relatively far from the resistance switching material layer 50 may have a relatively small conduction band offset, as illustrated in FIG. 4.

Also, as illustrated in FIGS. 2 and 5, when the self-rectifying layer 30 is disposed above the resistance switching material layer 50 and current is supplied through the second electrode 70 that is disposed above the self-rectifying layer 30, the second area 35 relatively far from the resistance switching material layer 50 may have a relatively large conduction band offset and the first area 31 disposed relatively close to the resistance switching material layer 50 may have a relatively small conduction band offset, as illustrated in FIG. 6.

In example embodiments, the resistance switching material elements 100, 200, 300, and 400 may be provided with a structure in which current is supplied through the first electrode 10 that corresponds to a lower electrode. In this case, the self-rectifying layer 30 may be provided such that the first area 31 relatively close to the first electrode 10 may have a relatively large conductive band offset. In the following description, for convenience of explanation, an example that the second area 35 relatively close to the second electrode 70 that corresponds to an upper electrode has a relatively large conductive band offset is described.

To embody the self-rectifying layer 30 that uses tunneling properties, the self-rectifying layer 30 may have a band structure in which a portion having a large conduction band offset and a portion having a small conduction band offset contact each other, as illustrated in FIGS. 4 and 6.

The first area 31 and the second area 35 may have a conduction band offset difference of about 1.0 eV or higher, for example, more than or equal to about 1.0 eV and less than or equal to about 4.0 eV.

To have the above conduction band offset difference, the first area 31 may be formed to have a conduction band offset of, for example, about 0.1 eV to about 1.5 eV and the second area 35 may be formed to have a conduction band offset of, for example, about 1.0 eV to about 5.0 eV.

The self-rectifying layer 30 may be formed of, for example, a dielectric material layer to have the above conduction band offset. In other words, the first area 31 may be formed of a first dielectric material layer and the second area 35 may be formed of a second dielectric material layer that is different from the first dielectric material layer. The self-rectifying layer 30 may have a structure having at least two layers respectively including the first dielectric material layer and the second dielectric material layer. Any one of the first and second dielectric material layers may be a low dielectric material layer having a relatively large conduction band offset and the other one may be a high dielectric material layer having a relatively low conduction band offset.

Considering that a conduction band offset may increase as permittivity decreases and a conduction band offset may decrease as permittivity increases, when current is supplied through the second electrode 70 that is the upper electrode, the second area 35 relatively close to the second electrode 70 may be formed as a low dielectric material layer having a relatively large conduction band offset and the first area 31 relatively far from the second electrode 70 may be formed as a high dielectric material layer having a relatively small conduction band offset.

At least any one of the first and second dielectric material layers respectively forming the first and second areas 31 and 35 may be formed of a dielectric material selected from the group consisting of $SiO_2$, $Al_2O_3$, $Y_2O_3$, $La_2O_3$, $HfO_2$, $ZrO_2$, $Nb_2O_5$, $TiO_2$, $Ta_2O_5$, $(Ba, Sr)TiO_3$, and $SrTiO_3$. $SiO_2$, $Al_2O_3$, $Y_2O_3$, $La_2O_3$, $HfO_2$, $ZrO_2$, $Nb_2O_5$, $TiO_2$, $Ta_2O_5$, $(Ba, Sr)TiO_3$, and $SrTiO_3$, which are sequentially arranged in an order that a conduction band barrier value decreases, that is, from a low permittivity to a high permittivity. Thus, the first and second areas 31 and 35 each may be formed of a dielectric material selected from the above dielectric materials under a condition that the second area 35 has a permittivity lower than the first area 31. For example, when the second area 35 is formed of $SiO_2$, the first area 31 may be formed of a dielectric material selected from the group consisting of $Al_2O_3$, $Y_2O_3$, $La_2O_3$, $HfO_2$, $ZrO_2$, $Nb_2O_5$, $TiO_2$, $Ta_2O_5$, $(Ba, Sr)TiO_3$, and $SrTiO_3$ having a larger permittivity than that of $SiO_2$. Also, when the second area 35 is formed of $Al_2O_3$, the first area 31 may be formed of a dielectric material selected from the group consisting of $Y_2O_3$, $La_2O_3$, $HfO_2$, $ZrO_2$, $Nb_2O_5$, $TiO_2$, $Ta_2O_5$, $(Ba, Sr)TiO_3$, and $SrTiO_3$ having a larger permittivity than that of $Al_2O_3$. In other words, at least one of the first and second areas 31 and 35 may be formed of one of $SiO_2$, $Al_2O_3$, $Y_2O_3$, $La_2O_3$, $HfO_2$, $ZrO_2$, $Nb_2O_5$, $TiO_2$, $Ta_2O_5$, $(Ba, Sr)TiO_3$, and $SrTiO_3$.

Instead of having the structure having at least two layers respectively including the first and second dielectric material layers, the self-rectifying layer 30 may be formed of a dielectric material as a whole, and may be provided such that an area having a desired (and/or alternatively predetermined) thickness relatively has a high permittivity or a low permittivity compared to the other area having a remaining thickness and thus the first and second areas 31 and 35 may have different permittivities in a thickness direction. In this case, the self-rectifying layer 30 may be formed of a dielectric material as a whole, the dielectric material being selected from the group consisting of $SiO_2$, $Al_2O_3$, $Y_2O_3$, $La_2O_3$, $HfO_2$, $ZrO_2$, $Nb_2O_5$, $TiO_2$, $Ta_2O_5$, $(Ba, Sr)TiO_3$, and $SrTiO_3$. A portion having a relatively high permittivity, for example, compared to the other portion, may correspond to the first area 31 and the other portion may correspond to the second area 35. The first and second areas 31 and 35 may be formed to satisfy the same conduction band offset condition as that of the above-described structure having at least two layers including the first and second dielectric material layers.

Figure 7:
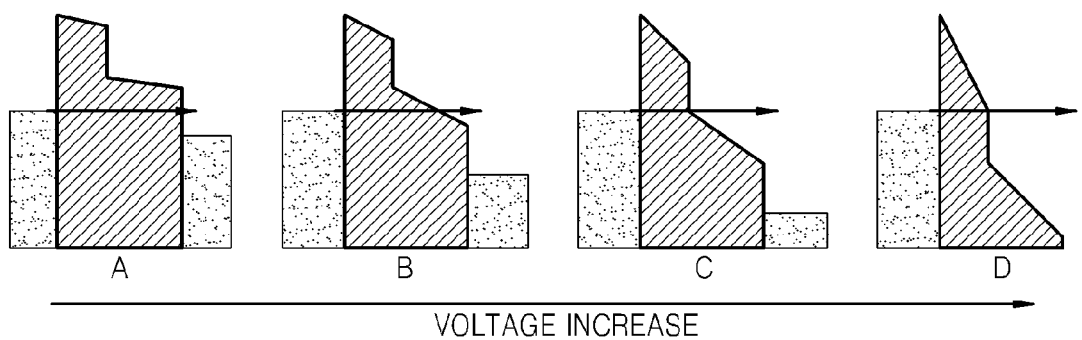
FIG. 7 illustrates a change in a band diagram according to an increase in voltage, when a band structure is formed in which a portion having a large conduction band and a portion having a small conduction band contact each other in a self-rectifying layer as in FIGS. 4 and 6.
Figure 8:
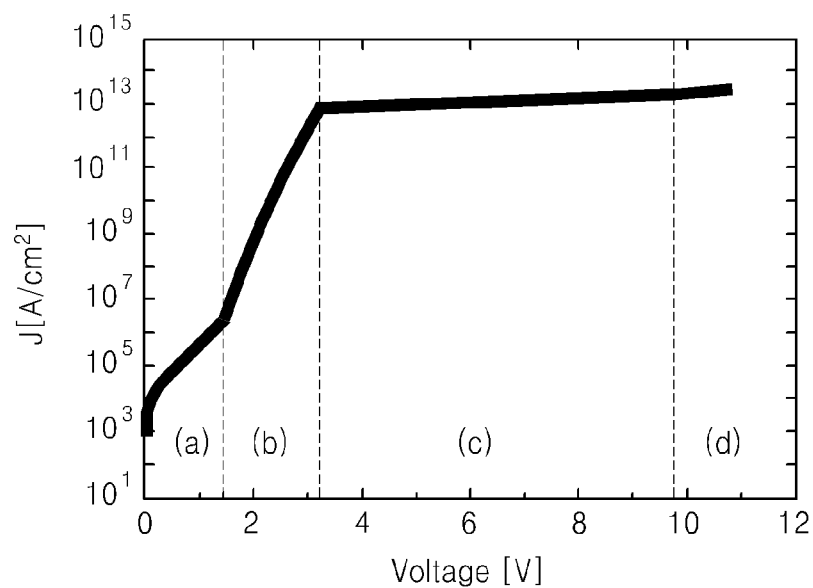
FIG. 8 is a graph showing a change in tunneling current properties when a band diagram changes as in FIG. 7.

FIG. 7 illustrates a change in a band diagram according to an increase in voltage, when a band structure is formed in which a portion having a large conduction band and a portion having a small conduction band contact each other in the self-rectifying layer 30 as in FIGS. 4 and 6. FIG. 8 is a graph showing a change in tunneling current properties when a band diagram changes as in FIG. 7.

Referring to FIG. 7, as a voltage increase, the shape of a band changes in an order of sections (a), (b), (c), and (d). Current-voltage properties in each section change as illustrated in FIG. 8. Referring to FIG. 8, the amount of current density increases greatly from the section (a) to the section (b) and these sections (a) and (b) may be used as a selector. In FIG. 8, a horizontal axis denotes a voltage (volts) and a vertical axis denotes current density ($A/cm^2$). Example embodiments are not limited the voltage and current density values indicated on the horizontal and vertical axes in FIG. 8. Instead, the voltage and current density values indicated on the horizontal and vertical axes in FIG. 8 are used to merely show a relatively change as an example. The current density-voltage value in a section where a change in the current density-voltage properties occurs may vary diversely according to the design of an element.

In resistance switching material elements 100, 200, 300, and 400 according to example embodiments, the resistance switching material layer 50 is provided such that resistance of a resistance switching material may vary according to an applied voltage. When the resistance switching material elements 100, 200, 300, and 400 are employed as memory cells of a memory device, the resistance switching material layer 50 becomes a memory layer for storing data using a change in resistance. The resistance switching material layer 50 may be formed of a metal oxide layer exhibiting resistance change properties according to the applied voltage.

Figure 9:
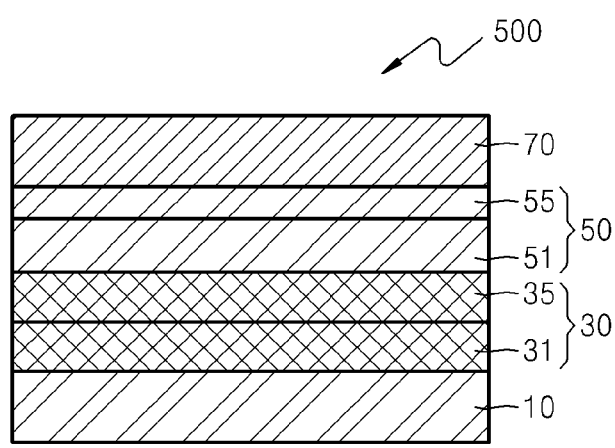
FIG. 9 schematically illustrates a resistance switching material element according to example embodiments.
Figure 10:
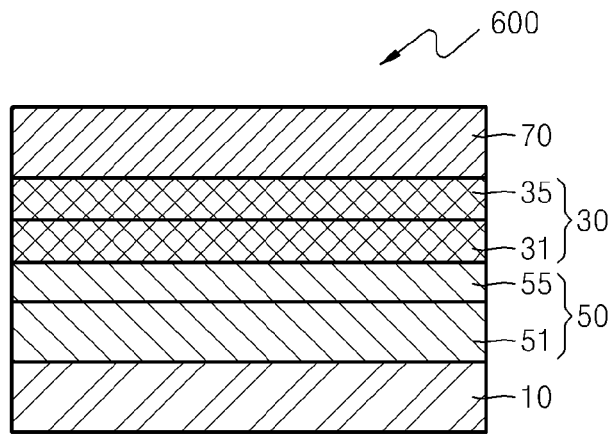
FIG. 10 schematically illustrates a resistance switching material element according to example embodiments.

The resistance switching material layer 50 may have a multilayer structure. For example, the resistance switching material layer 50 may have a dual layer structure of a first material layer 51 and a second material layer 55 as illustrated in FIGS. 9 and 10. FIG. 9 schematically illustrates a resistance switching material element 500 according to example embodiments. The resistance switching material element 500 of FIG. 9 corresponds to the case in which the resistance switching material layer 50 has a dual layer structure in the resistance switching material element 300 of FIG. 3. FIG. 10 schematically illustrates a resistance switching material element 600 according to example embodiments. The resistance switching material element 600 of FIG. 10 corresponds to the case in which the resistance switching material layer 50 has a dual layer structure the resistance switching material element 400 of FIG. 5. The resistance switching material layer 50 of FIGS. 1 and 2 may have a dual layer structure of the first material layer 51 and the second material layer 55, as illustrated in FIGS. 9 and 10.

The resistance switching material layer 50, for example, may be provided to have resistance switching properties due to ionic species transfer between the first material layer 51 and the second material layer 55.

The first material layer 51 of the resistance switching material layer 50 may be formed of a metal oxide. In detail, the first material layer 51 may include at least one of Ta oxide, Zr oxide, Y oxide, yttria-stabilized zirconia (YSZ), Ti oxide, Hf oxide, Mn oxide, Mg oxide, and any combinations thereof. The first material layer 51 may be a nonstoichiometric oxide, for example, a $TaO_x$ layer, where the range of "x" may be $0 \le x \le 2.5$, for example, $0.5 \le x \le 2.0$. Oxygen ions and/or oxygen vacancies may exist in the first material layer 51. The first material layer 51 may function as an oxygen supplying layer or oxygen reservoir layer with respect to the second material layer 55. The first material layer 51 may be a layer doped with a desired (and/or alternatively predetermined) metal. Here, the desired (and/or alternatively predetermined) metal may signify a different metal other than a base material (metal) of the first material layer 51. The desired (and/or alternatively predetermined) metal may be, for example, tungsten (W). When the first material layer 51 doped with the desired (and/or alternatively predetermined) metal is used, the resistance switching material layer 50 may have, for example, multi-bit memory properties. The thickness of the first material layer 51 may be, for example, about 1 nm to about 100 nm, particularly, about 5 nm to about 50 nm.

The second material layer 55 may exchange oxygen ions and/or oxygen vacancies with the first material layer 51 and may be a layer inducing resistance switching of the resistance switching material layer 50. In this point of view, the second material layer 55 may be referred to as an oxygen exchange layer. The second material layer 55 may be formed of a metal oxide that is the same as or different from the first material layer 51. For example, the second material layer 55 may include at least one of Ta oxide, Zr oxide, Y oxide, YSZ, Ti oxide, Hf oxide, Mn oxide, Mg oxide, and combinations thereof. The metal oxide forming the second material layer 55 may have a stoichiometric composition or a composition close thereto. In detail, a Ta oxide of the metal oxides forming the second material layer 55 may be $Ta_2O_5$ or may have a composition close thereto. Similarly to the first material layer 51, the second material layer 55 may include oxygen ions and/or oxygen vacancies. The resistivity of the second material layer 55 may be different from that of the first material layer 51. For example, the resistivity of the second material layer 55 may be greater than that of the first material layer 51.

In an ON state in which a current path is formed in the second material layer 55, the resistance of the resistance switching material layer 50 may be determined by the resistance of the first material layer 51. In an OFF state in which no current path is formed in the second material layer 55, the resistance of the resistance switching material layer 50 may be determined by the resistance of the second material layer 55. The oxygen concentration of the second material layer 55 may he higher than that of the first material layer 51. In some cases, however, the oxygen concentration of the second material layer 55 may not be higher than that of the first material layer 51. When the second material layer 55 is formed of the same metal oxide as the first material layer 51, the oxygen concentration of the second material layer 55 may be higher than that of the first material layer 51. When the second material layer 55 is formed of a metal oxide different from that of the first material layer 51, the oxygen concentration of the second material layer 55 may not be necessarily higher than that of the first material layer 51. The thickness of the second material layer 55 may be thinner than that of the first material layer 51. The second material layer 55 may have a thickness of about 1 nm to about 50 nm, for example, about 5 nm to about 20 nm. The resistance switching properties (speed and ON/OFF ratio, etc.) of the resistance switching material elements 100 and 200 may vary according to properties of the second material layer 55, that is, the oxygen exchange layer.

In addition, similarly to the first material layer 51, at least a part of the second material layer 55 may be doped with a desired (and/or alternatively predetermined) metal. The metal may be the same as the metal the first material layer 51 is doped with. For example, the second material layer 55 may be doped with tungsten (W).

In the cases of FIGS. 2, 5, and 10, a buffer layer (not shown) may be further provided between the first electrode 10 and the resistance switching material layer 50. In the cases of FIGS. 1, 3, and 9, a buffer layer (not shown) may be provided between the first electrode 10 and the self-rectifying layer 30. The buffer layer may be used as a buffer of the material layer formed thereon. Alternatively, when a material layer is formed on the buffer layer, the buffer layer may be used to prevent diffusion of impurities, such as oxygen, into the first electrode 10 from the material layer.

The buffer layer may improve stability, reliability, and reproducibility of the resistance switching properties during a set/reset operation. For example, during the initial set operation, that is, a forming operation, the buffer layer may restrict/prevent a chemical reaction between the first electrode 10 and the first material layer 51 and between the first electrode 10 and the ionic species of the first material layer 51. Also, the buffer layer may prevent a reaction between the first material layer 51 and the first electrode 10 when the first material layer 51 is formed. Thus, when the buffer layer is applied between the first electrode 10 and the resistance switching material layer 50, the chemical reaction is restricted/prevented and thus stability, reliability, and reproducibility of the resistance switching properties may be improved/secured. In particular, since not only noble metal but also inexpensive base metal and conductive oxide may be easily employed as a material of the first electrode 10 due to the introduction of such a buffer layer, manufacturing costs may be lowered and various merits may be obtained in terms of a process.

The buffer layer may include a material having interatomic bonding energy greater than the resistance switching material layer 50. In other words, the buffer layer may be formed of a material stabler than the resistance switching material layer 50 in terms of bonding energy. Accordingly, the interatomic bonding energy in the buffer layer may be greater than bonding energy between elements, for example, Ta—O, in the first material layer 51. Also, the buffer layer may include a material that increases a potential barrier between the first electrode 10 and the resistance switching material layer 50. In this case, a conduction band offset between the buffer layer and the first electrode 10 may be greater than that between the first material layer 51 and the first electrode 10. This means that the buffer layer may be formed of a material that restricts excess current flow between the first electrode 10 and the first material layer 51. Also, in a viewpoint similar thereto, the buffer layer may include a material having a resistivity higher than that of the resistance switching material layer 50.

The material forming the buffer layer may be, for example, $Al_2O_3$ or $TiO_2$. Also, the buffer layer may include at least one of AlOx, SiOx, SiNx, ZrOx, HfOx, and any combinations thereof.

The buffer layer may have an appropriate composition and thickness that enables the buffer layer to function as a buffer and simultaneously allow flow of current. The thickness of the buffer layer may be, for example, less than or equal to about 10 nm. When the buffer layer has a stoichiometric composition, the thickness of the buffer layer may be less than or equal to about 5 nm. This is because insulation properties of the buffer layer may be great when the buffer layer is excessively thick.

A buffer layer may be further provided between the second electrode 70 and the resistance switching material layer 50. For example, in the case of FIG. 9, a buffer layer may be further provided between the second electrode 70 and 55. In this case, the buffer layer may further improve the stability, reliability, and reproducibility of the resistance switching properties of the resistance switching material layer 50 and may increase types of materials to be used for the second electrode 70.

In example embodiments, resistance switching material elements 100, 200, 30, 400, 500, and 600, during a set operation in which a positive (+) voltage is applied to the first electrode 10 and a negative (−) voltage is applied to the second electrode 70, oxygen vacancies are transferred from the first material layer 51 to the second material layer 55 and thus a current path (not shown) may be formed in the second material layer 55. Accordingly, the resistance of the resistance switching material layer 50 may lower. In other words, the resistance switching material layer 50 may be changed from the OFF state to the ON state. In the set operation, oxygen ions may be transferred in the opposite direction to that of the oxygen vacancies, that is, from the second material layer 55 to the first material layer 51.

On the other hand, during a reset operation in which a negative (−) voltage is applied to the first electrode 10 and a positive (+) voltage is applied to the second electrode 70, oxygen vacancies are transferred from the second material layer 55 to the first material layer 51, that is, oxygen ions are transferred from the first material layer 51 to the second material layer 55, and thus the current path formed in the second material layer 55 may be discontinued. Thus, the resistance of the resistance switching material layer 50 may be raised. In other words, the resistance switching material layer 50 may be changed from the ON state to the OFF state.

Figure 11:
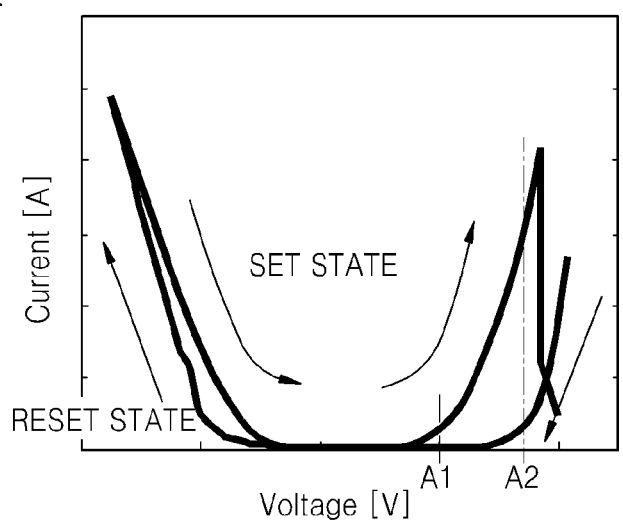
FIG. 11 is a graph showing resistance switching properties of resistance switching material elements having the self-rectifying layer, according to example embodiments.
Figure 12:
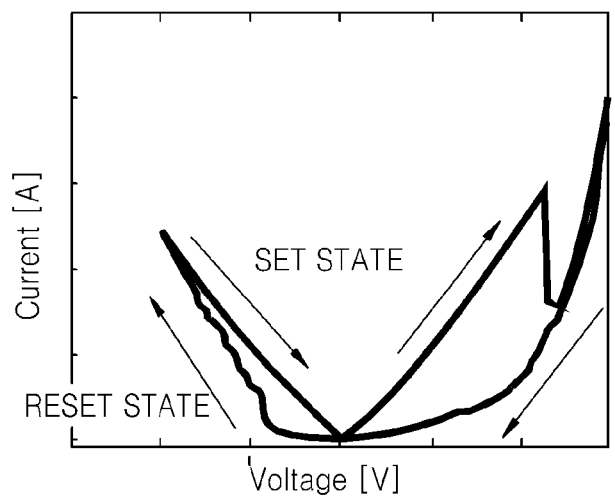
FIG. 12 is a graph showing resistance switching properties of a resistance switching material element without a self-rectifying layer, as a comparative example.

FIG. 11 is a graph showing resistance switching properties of the resistance switching material elements 100, 200, 300, 400, 500, and 600 having the self-rectifying layer 30, according to example embodiments. FIG. 12 is a graph showing resistance switching properties of a resistance switching material element without a self-rectifying layer, as a comparative example. In the resistance switching material elements 100, 200, 300, 400, 500, and 600 having the self-rectifying properties according to example embodiments, a current change according to a voltage during the set operation may have non-linear properties as illustrated in FIG. 11. Contrarily, for the resistance switching material element without the self-rectifying properties, the current change according to a voltage during the set operation shows linear properties as illustrated in FIG. 12.

In resistance switching material elements 100, 200, 300, 400, 500, and 600 according to example embodiments, a resistance change hardly occurs until an applied voltage reaches a desired (and/or alternatively predetermined) amount, for example, a voltage A1, as illustrated in FIG. 11. The resistance change occurs greatly during when the voltage increases to a voltage A2. Thus, for example, according to a memory device employing the resistance switching material elements 100, 200, 300, 400, 500, and 600 according to example embodiments as memory cells, even when there is an interference signal from adjacent memory cell, data may be accurately read or written. The voltage A1 may correspond to a voltage by the interference signal of an adjacent memory cell and the voltage A2 may correspond to a voltage applied for reading or writing data.

On the other hand, in an element without the self-rectifying properties, current changes linearly according to a voltage increase as illustrated in FIG. 12. Accordingly, it may be seen that the effect of the interference signal of an adjacent memory cell is great.

FIGS. 13, 14, 15A, and 15B are perspective views illustrating examples of memory devices employing one or more resistance switching material elements, according to example embodiments. In example embodiments, a memory device may be a crossbar point array resistive memory device.

Figure 13:
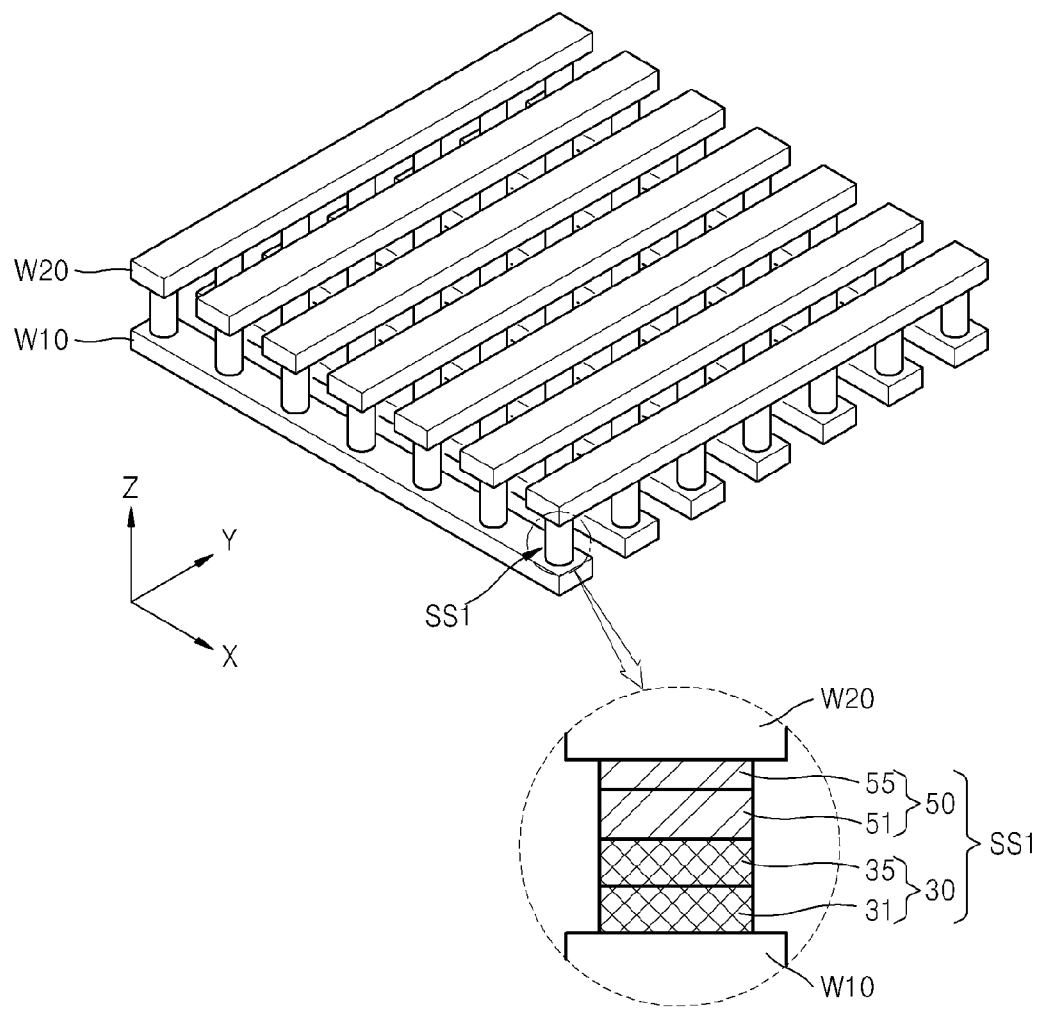
FIGS. 13, 14, 15A, and 15B are perspective views illustrating examples of memory devices employing one or more resistance switching material elements, according to example embodiments.

Referring to FIG. 13, a resistive memory device may include a plurality of first wirings W10 arranged in a first direction, for example, in an X-axis direction, parallel to each other. Also, the resistive memory device may include a plurality of second wirings W20 arranged in a direction crossing the first wirings W10, for example, in a Y-axis direction, parallel to each other. A memory cell SS1 may be located in at least some intersections of the first wirings W10 and the second wirings W20, thereby forming a crossbar point array structure.

In example embodiments, the memory cell SS1 may be formed of the resistance switching material elements 100, 200, 300, 400, 500, and 600 and have various stack structures described with reference to FIGS. 1 2, 3, 5, 9, and 10. Each of the first wirings W10 and each of the second wirings W20 may respectively correspond to the first electrode 10 and the second electrode 70 of each of FIGS. 1, 2, 3, 5, 9, and 10.

The memory cell SS1 may include the self-rectifying layer 30 and the resistance switching material layer 50 stacked on each of the first wirings W10 to be located at the intersection of the first and second wirings W10 and W20. In other words, the memory cell SS1 may include the resistance switching material layer 50 and the self-rectifying layer 30 that is provided between the resistance switching material layer 50 and any one of the first and second wirings W10 and W20. FIG. 13 illustrates an example in which the memory cell SS1 has the stack structure of the resistance switching material element 500 of FIG. 9. The self-rectifying layer 30 may include, for example, the first area 31 and the second area 35. The resistance switching material layer 50 may include, for example, the first material layer 51 and the second material layer 55. The structures, physical properties, and operational properties of the resistance switching material layer 50 and 30 are the same as those described above and thus repeated descriptions are omitted herein.

A buffer layer (not shown) may be provided between the first wirings W10 and the resistance switching material layer 50. When the self-rectifying layer 30 is located between the first wirings W10 and the resistance switching material layer 50, as illustrated in FIG. 13, the buffer layer may be provided between the first wirings W10 and the self-rectifying layer 30.

Although FIG. 13 illustrates the stack structure as a cylinder shape, the memory cell SS1 may have a variety of modified shapes, such as a rectangular column, or a shape having a width increasing downward.

Figure 14:
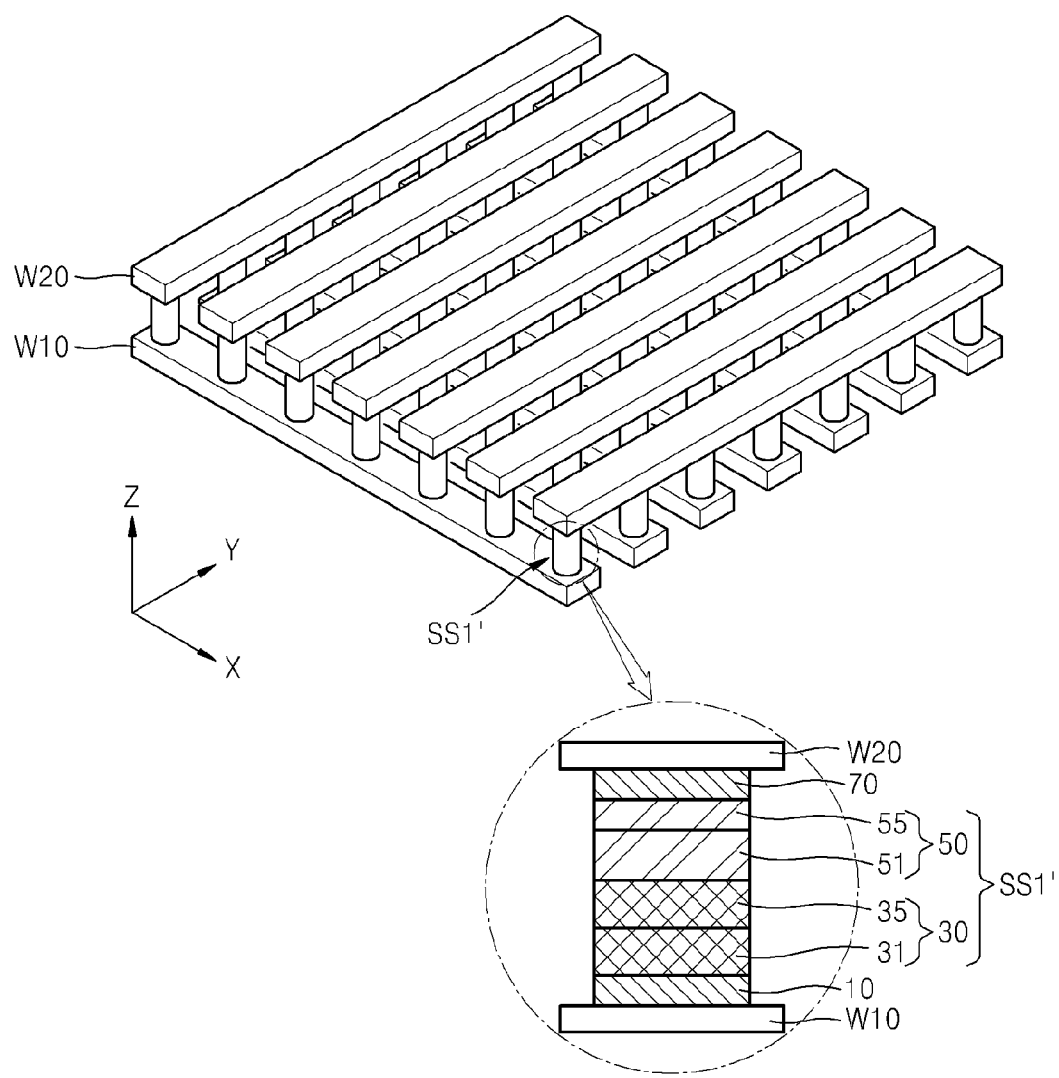

Referring to FIG. 14, a resistive memory device according to example embodiments may be the same as the resistive memory device illustrated in FIG. 13, except each memory cell SS1 may be located between a corresponding first electrode 10 and second electrode 70. As shown in FIG. 14, a plurality of first electrodes 10 may be between the first wirings W10 and the memory cells SS1, and a plurality of second electrodes 70 may be between the memory cells SS1 and the second wirings W20. The structures and properties of the memory cell SS1, first and second electrodes 10 and 70, first and second wirings W10 and W20 are the same as those described above and thus repeated descriptions are omitted herein.

According to example embodiments, when an operational voltage is applied to a particular memory cell through the first and second wirings W10 and W20, data may be written to a corresponding memory cell.

When a set voltage is applied to a particular memory cell via the first and second wirings W10 and W20, oxygen vacancies are transferred from the first material layer 51 to the second material layer 55, that is, oxygen ions are transferred from the second material layer 55 to the first material layer 51, in the particular memory cell. As a result, a current path (not shown) is formed in the second material layer 55. Thus, the resistance of the resistance switching material layer 50 lowers so that the resistance switching material layer 50 may be changed from the OFF state to the ON state. In this case, a first bit data, for example, "0" (or "1"), may be regarded to be written to the particular memory cell. Since the particular memory cell is not affected by an interference signal of an adjacent memory cell due to the self-rectifying layer 30, accurate data recording is possible.

When a reset voltage is applied to a particular memory cell via the first and second wirings W10 ad W20, oxygen vacancies are transferred from the second material layer 55 to the first material layer 51, that is, oxygen ions are transferred from the first material layer 51 to the second material layer 55, in the particular memory cell. As a result, the current path formed in the second material layer 55 is discontinued. Thus, the resistance of the resistance switching material layer 50 is great so that the resistance switching material layer 50 may be changed from the ON state to the OFF state. In this case, a second bit data, for example, "1" (or "0"), may be regarded to be written to the particular memory cell.

Also, a memory device according to example embodiments may have a structure in which the memory cell is repeatedly stacked, that is, a plurality of stack structures including a wiring, the memory cell, a wiring, the memory cell, a wiring, etc.

Figure 15A:
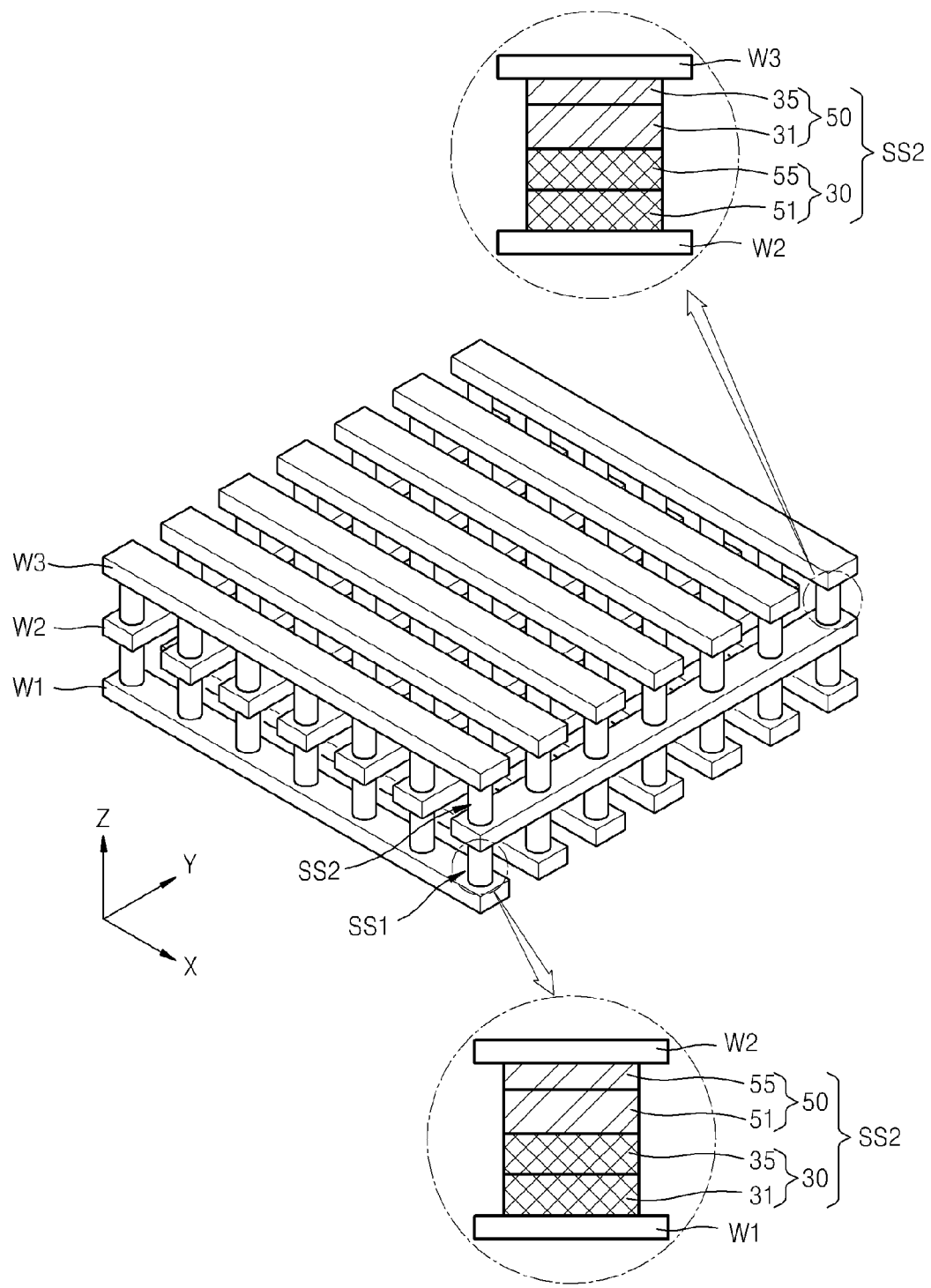

For example, referring to FIG. 15A, a memory device according to example embodiments may include a plurality of first wirings W1 arranged in a first direction parallel to each other, a plurality of second wirings W2 arranged in a second direction parallel to each other, and a plurality of third wirings W3 arranged in the first direction parallel to each other. The plurality of second wirings W2 may cross over the plurality of first wirings W1, and the plurality of third wirings W3 may cross over the plurality of second wirings W2. Memory cells SS1 may be located in at least some intersections of the first wirings W1 and the second wirings W2, where the memory cells SS1 may be connected to a corresponding one of the first wirings W1 and a corresponding one of the second wirings W2. Other memory cells SS2 may be located in at least some intersections of the second wirings W2 and the third wirings W3, where the memory cells may be connected to a corresponding one of the second wirings W2 and a corresponding one of the third wirings W3.

Figure 15B:
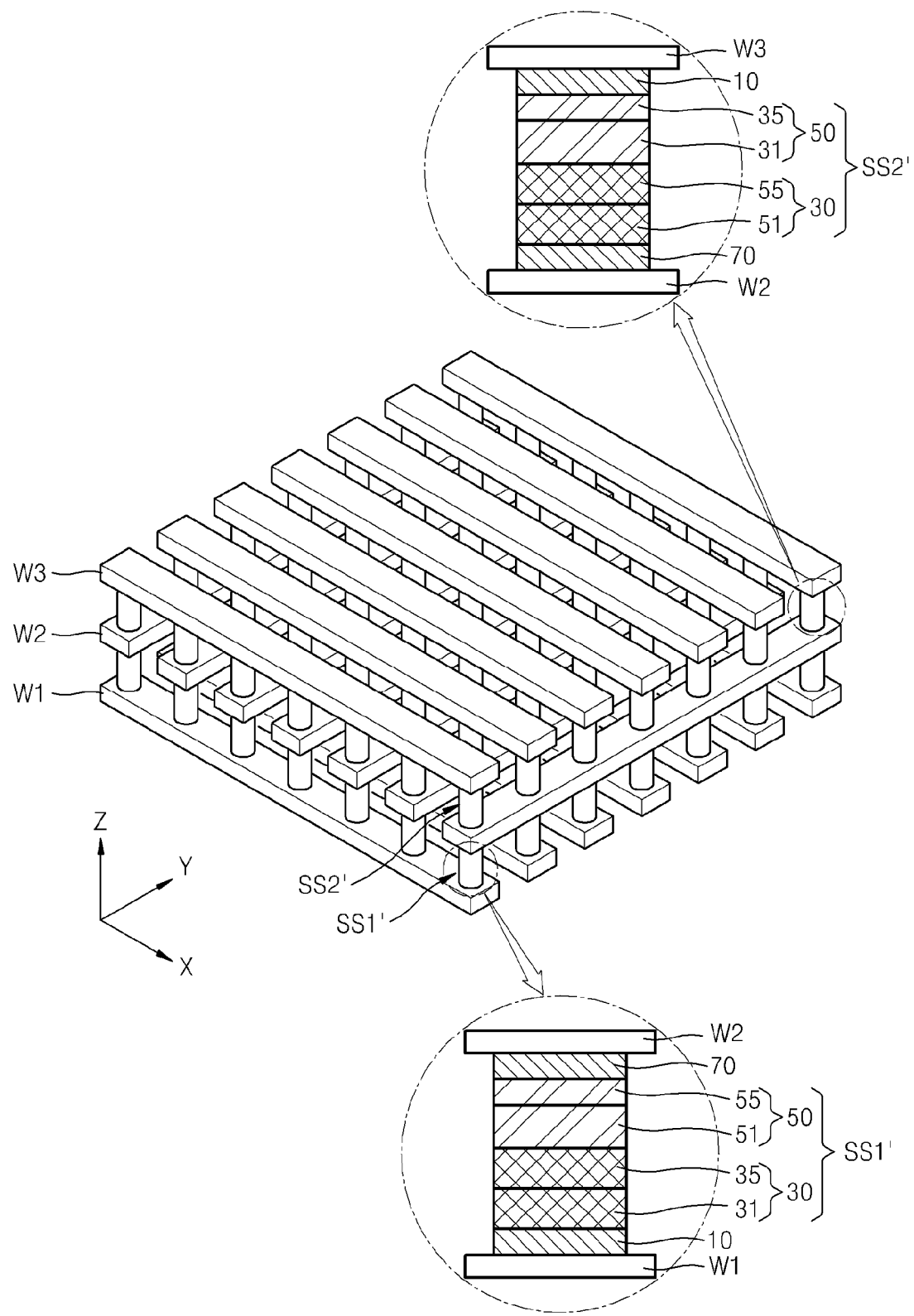

Referring to FIG. 15B, a memory device may according to example embodiments may be the same as the memory device described in FIG. 15A, except each memory cell SS1' and/or SS2' may be located between a corresponding first electrode 10 and second electrode 70.

In example embodiments, the memory cells SS1, SS1', SS2, and SS2' may be formed of the resistance switching material elements 100, 200, 300, 400, 500, and 600 and have various stack structures described with reference to FIGS. 1 2, 3, 5, 9, and 10.

As described above, according to the one or more resistance switching material element according to example embodiments, since the resistance switching material element has self-rectifying properties, when the resistance switching material element is used in the form of an integrated device in which a crossbar point array or crossbar structure is partially included, for example, an interference signal from an adjacent memory cell during data writing or reading may be blocked and thus accurate data reading or writing is possible.

Also, since a selector does not need to be separately provided, the number of processes and manufacturing costs may be reduced and further, and also the resistance switching material element may be applied to a device having a limited thickness.

Furthermore, since a resistance switching material element having properties of a selector may be implemented without an external selector, a degree of integration may be improved in comparison with an existing method of forming and connecting a selector and a resistance switching element on a vertical or horizontal plane, and also production costs may also be reduced.

It should be understood that example embodiments described herein should be considered in a descriptive sense only and not for purposes of limitation. Descriptions of features or aspects within each resistance switching material element and/or memory device according to example embodiments should typically be considered as available for other similar features or aspects in other resistance switching material element and/or memory devices according to example embodiments.

What is claimed is:

1. A resistance switching material element comprising:
a first electrode;
a self-rectifying layer directly on the first electrode, the self-rectifying layer including a first dielectric material layer directly on the first electrode and a second dielectric material layer on the first dielectric material layer in a thickness direction of the self-rectifying layer, and the first dielectric material layer and the second dielectric material layer having different conduction band offsets from each other;
a resistance switching material layer on the self-rectifying layer to contact the self-rectifying layer, the resistance switching material layer including a first material layer and a second material layer, and the resistance switching material layer being configured to have resistance switching properties due to ionic species transfer between the first and second material layers; and
a second electrode directly on the resistance switching material layer, wherein
the self-rectifying layer is configured to have a tunneling mechanism that varies according to an applied voltage, and
the self-rectifying layer is configured to have direct tunneling properties in which a flow of current is restricted if a first voltage is applied to the resistance switching material element,
the self-rectifying layer is configured to have tunneling properties in which the flow of current rapidly increases if a second voltage is applied to the resistance switching material element, and
the first voltage is less than the second voltage.

2. The resistance switching material element of claim 1, wherein
the second-dielectric material layer has a relatively larger conduction band offset than a conduction band offset of the first dielectric material layer.

3. The resistance switching material element of claim 1, wherein
the conduction band offsets of the first and second dielectric material layers differ by about 0.5 eV or higher.

4. The resistance switching material element of claim 3, wherein the conduction band offset of the first and second dielectric material layers differ by about 1.0 eV to about 4.0 eV, inclusive.

5. The resistance switching material element of claim 1, wherein
a material of the second dielectric material layer is different than a material of the first dielectric material layer.

6. The resistance switching material element of claim 5, wherein
one of the first and second dielectric material layers is a low dielectric constant material layer having a relatively large conduction band offset, and
another of the first and second dielectric material layers is a high dielectric constant material layer having a relatively small conduction band offset.

7. The resistance switching material element of claim 6, wherein at least one of the first and second dielectric material layers includes one of $SiO_2$, $Al_2O_3$, $Y_2O_3$, $La_2O_3$, $HfO_2$, $ZrO_2$, $Nb_2O_5$, $TiO_2$, $Ta_2O_5$, $(Ba, Sr)TiO_3$, and $SrTiO_3$.

8. The resistance switching material element of claim 1, wherein
the first dielectric material layer and the second dielectric material layer have a first thickness and a second thickness, respectively, and
the first dielectric material layer and the second dielectric material layer have different permittivities in the thickness direction of the self-rectifying layer.

9. The resistance switching material element of claim 1, wherein
the first material layer is an oxygen supply layer, and
the second material layer is an oxygen exchange layer.

10. The resistance switching material element of claim 1, wherein
the first material layer is a first metal oxide,
the second material layer is a second metal oxide, and
the first metal oxide and the second metal oxide are one of the same and different from each other.

11. The resistance switching material element of claim 10, wherein
at least one of the first and second metal oxides comprises one of Ta oxide, Zr oxide, Y oxide, yttria-stabilized zirconia (YSZ), Ti oxide, Hf oxide, Mn oxide, Mg oxide, and combinations thereof.

12. The resistance switching material element of claim 10, wherein
an oxygen concentration of the second material layer is higher than an oxygen concentration of the first material layer.

13. The resistance switching material element of claim 1, wherein a conduction band offset at an interface of the first dielectric material layer and the second dielectric material layer is in a range of about 1.0 eV to about 4.0 eV, inclusive.

* * * * *